(12) United States Patent
Loeffelholz et al.

(10) Patent No.: US 6,635,821 B2
(45) Date of Patent: Oct. 21, 2003

(54) MODULE HAVING ANGLED RECEPTACLE

(75) Inventors: Todd Loeffelholz, Minnetonka, MN (US); Zakh Bluband, Minnetonka, MN (US); Joe Czyscon, Plymouth, MN (US); Terry McClellan, Maple Grove, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 10/093,950

(22) Filed: Mar. 7, 2002

(65) Prior Publication Data

US 2003/0168234 A1 Sep. 11, 2003

(51) Int. Cl.[7] ............................................... H01R 13/46
(52) U.S. Cl. .............................. 174/53; 174/66; 174/67; 220/241; 220/242
(58) Field of Search .............................. 174/53, 66, 67; 220/241, 242

(56) References Cited

U.S. PATENT DOCUMENTS

| | | | | |
|---|---|---|---|---|
| 3,622,684 A | * | 11/1971 | Press ............................ | 174/48 |
| 3,917,899 A | * | 11/1975 | Oliver .......................... | 174/57 |
| 5,087,796 A | * | 2/1992 | Norman ........................ | 174/67 |
| 5,387,761 A | * | 2/1995 | Simonis ........................ | 174/67 |
| 5,645,449 A | * | 7/1997 | Sabo ............................. | 439/540.1 |
| 5,963,109 A | | 10/1999 | Schiltmans ................... | 333/26 |
| 5,977,866 A | | 11/1999 | Joseph, Jr. et al. ......... | 340/384.1 |
| 6,127,630 A | * | 10/2000 | McKenzie et al. ........... | 174/58 |

\* cited by examiner

*Primary Examiner*—Dean A. Reichard
*Assistant Examiner*—Anton Harris
(74) *Attorney, Agent, or Firm*—Merchant & Gould PC

(57) ABSTRACT

A module for containing a circuit is provided that attenuates emitted signals without the use of a cover. The module includes a housing and a receptacle. The housing has a front having a certain thickness and the receptacle is accessible from the front of the housing. The receptacle is shaped to receive a circuit component and forms a waveguide.

19 Claims, 8 Drawing Sheets

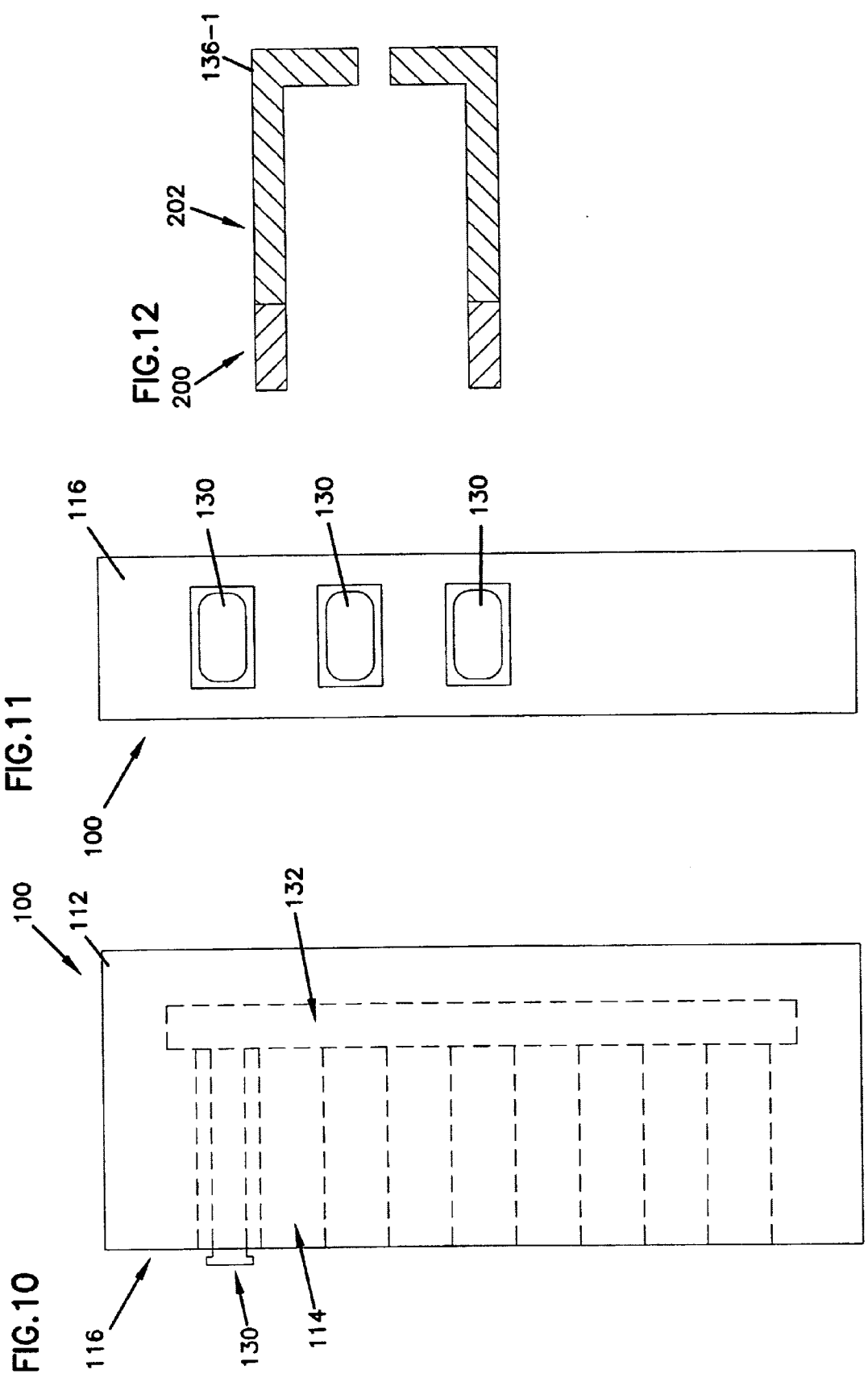

MODULE HAVING ANGLED RECEPTACLE

BACKGROUND OF THE INVENTION

In the telecommunications industry and more particularly in the video transmission industry, signals (e.g., 5 MHz to 1 GHz) are carried over coax conductors from a headend to customers. At the headend of the systems, numerous signals are manipulated to achieve a wide variety of functions and objectives. For example, signals carried on numerous coax cables may be combined onto a single coax conductor. Similarly, a signal on a main coax conductor may be divided into a plurality of signals carried on branch coax conductors.

In addition to combining, splitting, diverting or adding signals, the headend will also include a module for modifying signals. For example, in order to adequately tune the system, it may be desirable to provide attenuators or the like to attenuate a signal to a desired level. Further, as a broadband RF signal is carried over a length of cable, the high frequency range of the signal may be attenuated more than a low frequency range of the signal. As a result, equalizers are utilized to modify the signal to have a level intensity throughout its frequency range.

Frequently, tuning is accomplished through the use of plug-in devices (e.g., attenuators or equalizers). Exemplary systems including plug-in devices are disclosed in U.S. Pat. No. 6,289,210 which is hereby incorporated by reference.

Typically, a module such as a combiner has receptacles mounted on a printed circuit board. Terminals of a plug extend into a receptacle and are electrically coupled to the circuit board by electrical components that are all located on the same side of the circuit board. In particular, electrical components communicate with the receptacle and electrically couple terminals of a plug to the proper layer of the circuit board using vias, for example, if necessary. This style of mounting increases the amount of signal radiating around the electrical components causing cross talk in adjacent circuits. Also, because the leads of the electrical components are inductive, special circuit designs are used to compensate.

It is desirable to improve the amount of isolation between adjacent ports on a module. In addition, it is desirable to reduce parasitics that reduce loss of a specific port and increase insertion loss.

It is important to provide electromagnetic shielding to modules that house electrical components. For example, in a combiner module, a plurality of attenuator plugs that house circuitry are inserted in one side of the module. For example, a plurality of attenuator plugs may be inserted in receptacles of the housing. Once the plugs are inserted, a conductive cover is placed over the plug and receptacles to shield the circuit board from the outside environment and vice versa. When the cover is removed for maintenance, for example, the module radiates signals into the outside environment about 60 dB down from the carrier. Such radiation interferes with the operation of the headend. Sometimes, it is possible that the cover is not replaced after the repair is completed. Other times the repairs may take hours to perform while the cover must remain off.

It is desirable to provide a module in which such emissions are at least 100 dB down from the carrier so that the possibility of interference is reduced. In addition, it is desirable to provide a module with improved shielding.

SUMMARY OF THE INVENTION

According to a first aspect of the invention, there is provided a module for containing a circuit. The module includes a housing and a receptacle. The housing has a front having a certain thickness and the receptacle is accessible from the front of the housing. The receptacle is shaped to receive a circuit component and forms a waveguide.

According to a second aspect of the invention, there is provided a module for containing a circuit. The module includes a housing and a receptacle. The housing has a front having a certain thickness and the receptacle is accessible from a surface of the housing. The receptacle is shaped to receive a circuit component forms a waveguide.

BRIEF DESCRIPTION OF THE DRAWINGS

FIG. 10 is a side view of a module according to another preferred embodiment of the present invention.

FIG. 11 is a front view of the module shown in FIG. 10.

FIG. 12 is a cross-sectional view of a portion of a receptacle according to a preferred embodiment of the present invention.

DETAILED DESCRIPTION OF THE PREFERRED EMBODIMENTS OF THE PRESENT INVENTION

Figure 1:
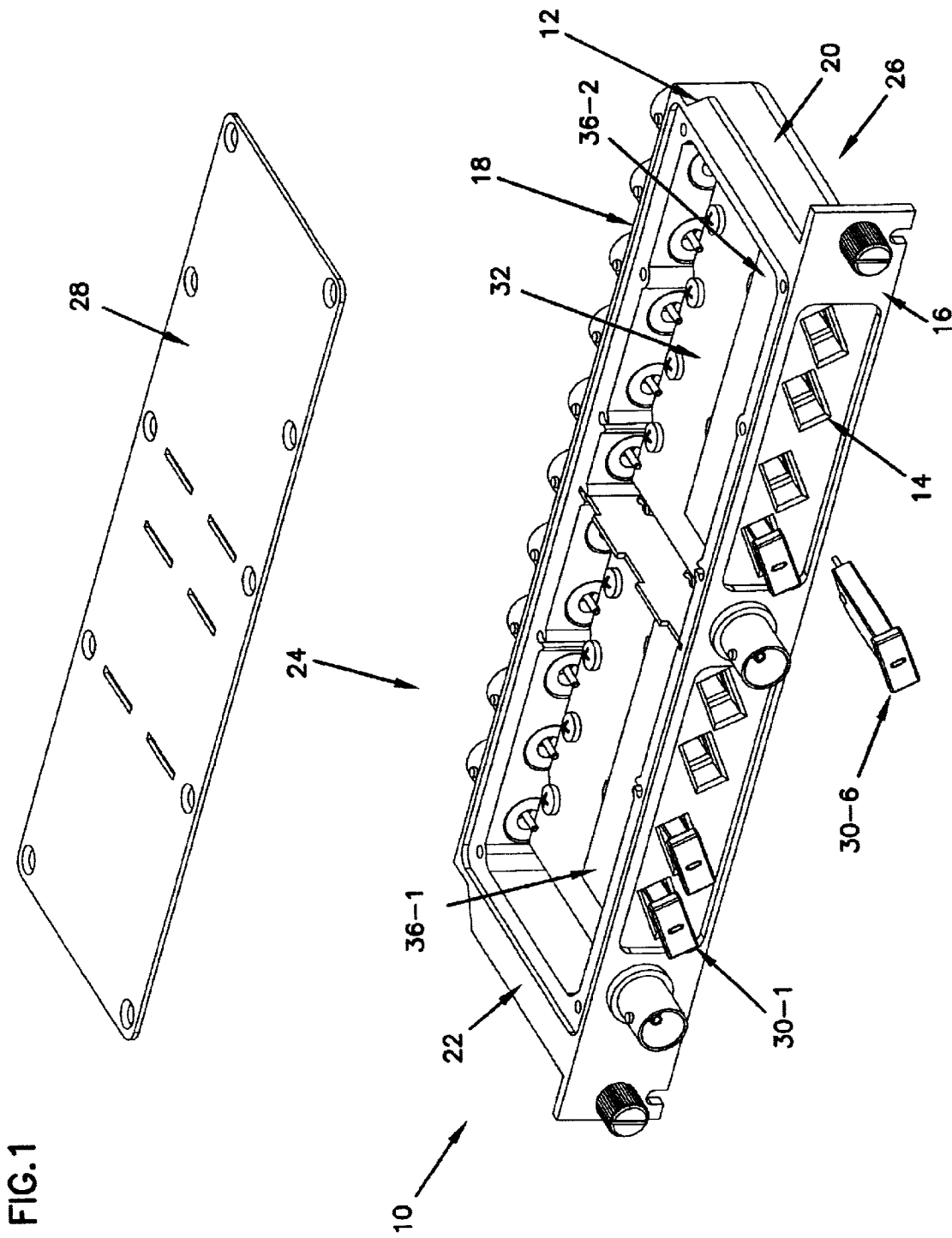
FIG. 1 is a perspective view of an eight port RF combiner module 10 according to a preferred embodiment of the present invention with a top plate removed.

Referring now to the drawing figures in which identical elements are numbered identically throughout, a description of the preferred embodiments of the present invention will now be provided.

It will be appreciated that the disclosed RF components are merely examples of the type of equipment to which the various aspects of the present invention are applicable. Thus, it will also be appreciated that the various aspects of the present invention are applicable to types of RF components other than those specifically shown. Further, the present invention has general applicability in the telecommunications field, and is not limited to RF applications.

FIG. 1 is a perspective view of an eight port RF combiner module 10 according to a preferred embodiment of the present invention with a top plate removed. The module 10 includes a housing 12. The housing 12 includes a front 16 and a back 18 opposite the front 16. The front and back 16, 18 are joined by a pair of sides 20 and 22. While the front and back are illustrated as being parallel to one another, they may be at an angle with respect to one another. In one preferred embodiment, major side 24 of the housing 12 is open and major side 26 is closed by a plate formed as an integral member of the rest of the housing 12 which can not be removed from the housing 12 and major side 24 is enclosed by a removable plate 28 secured to the housing 12 by fasteners (e.g., bolts or screws). Alternatively, major side 26 may be open as well and enclosed by a removable plate like major side 24.

The housing 12 is adapted for at least partially enclosing radio frequency circuitry (e.g splitter circuitry, combiner circuitry, etc.). While the circuitry could have any number of known configurations, preferably the circuitry is provided on a circuit board 32 sized to be mounted within the housing 12. The module 10 includes a at least one receptacle but preferably a plurality of receptacles 14 for each containing a plug 30 that is accessible from the front of the housing. While accessibility from the front of the module 10 is described as a preferred embodiment, if the plug 30 is to be accessed from the back, the bottom, top or sides of the module, the preferred embodiments of the present invention may be employed respectively in the back, the bottom, top or sides of the module 10 and the present invention is not limited to access only through the front of the module. The receptacle 14 which will be described in detail hereinafter may be formed by a combination of a cutout extending through the front 16 of the housing 12 and plug connectors 36-1, 36-2. Alternatively, the receptacles 14 may be formed by a plug connector having a built-in waveguide as will be described in detail hereinafter. Other combinations can be appreciated in providing a waveguide to shield EMI wherein the removable plug is accessed other than by the front of the module 10.

In one embodiment of the present invention, the front 16 of the housing 12 has a thickness, t, that creates a waveguide that provides a desired amount of attenuation for signal emitted from the housing 12. Preferably, the thickness ranges from about 0.2 inches to about 0.8 inches. More preferably, the thickness is about 0.25 inches and most preferably the thickness is about 0.75 inches. In a preferred embodiment, eight receptacles 14 are located in the housing 12. Each receptacle 14 is sized to receive a plug 30 therein. Each plug has a plastic housing which contains circuitry such as an attenuator circuit, equalizer circuit of other similar circuit. Terminals 29 (see FIG. 5) are exposed in a rear portion of the plug for electrically coupling the plug to circuitry located on the circuit board 32. Mounted at one edge of the circuit board 32 are plug connectors 36-1 and 36-2 as will be described in detail hereinafter with respect to FIG. 6. Four plugs 30 are received in one plug connector 36-1 and the remaining plugs 30 are received in the other plug connector 36-2. It will be appreciated that one plug connector may be provided to receive all of the plugs or that individual plug connectors may be provided for each plug or any combination of the above configurations. The phrase "plug connector" will be understood to include devices or arrangements adapted for receiving or otherwise providing electrical connections between the terminals of the plugs and the circuit board on which it is mounted. In the preferred embodiments, the plug connectors are adapted for providing electrical connections with multi-pin RF circuitry plugs such as equalizer plugs or attenuator plugs.

Figure 4:
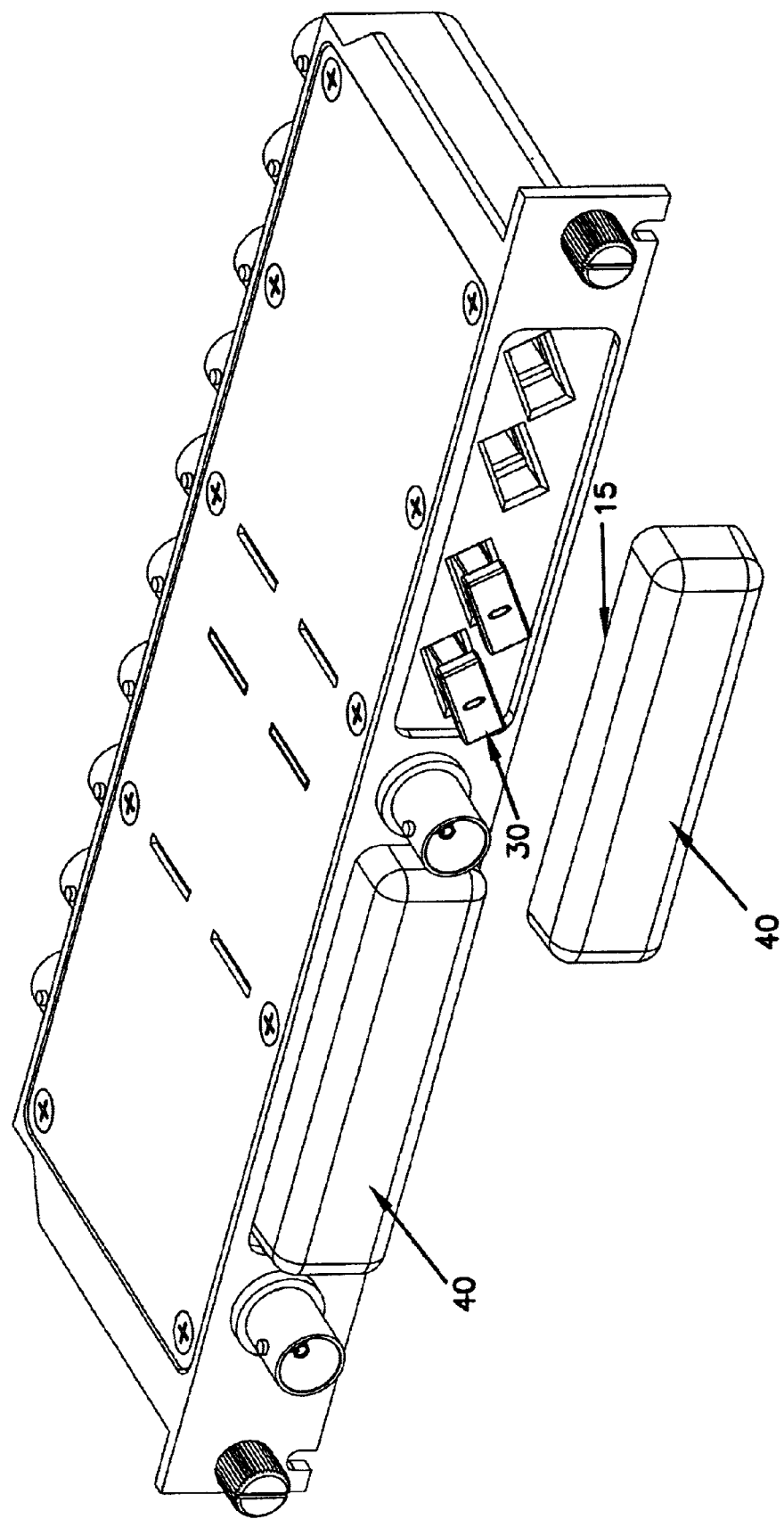
FIG. 4 is a perspective view of the module shown in FIG. 1 with one of the covers affixed to the front wall of the housing and the other cover removed therefrom.

When the circuit board 32 is mounted within the housing 12, the attenuator plugs 30 can be accessed from the front 16 of the housing 12 without the use of tools. The housing 12 may also include covers 40 that are secured to the front 16 of the housing 12 so as to cover the receptacles 14 as can be seen in FIG. 4. The cover 40 may be secured by snapping barbs 15, for example. By removing the cover 40 from the housing 12, the attenuator plugs 30 can be accessed. As will be described in detail herein after, unlike known systems that require conductive covers for EMI shielding, the module 10 according to the preferred embodiments of the present invention does not require such shielding. Covers 40 may be provided for aesthetic purposes or to prevent unauthorized access to the plugs, however, the covers 40 may be formed out of a nonconductive material such as plastic which provides a cost savings.

Figure 3:
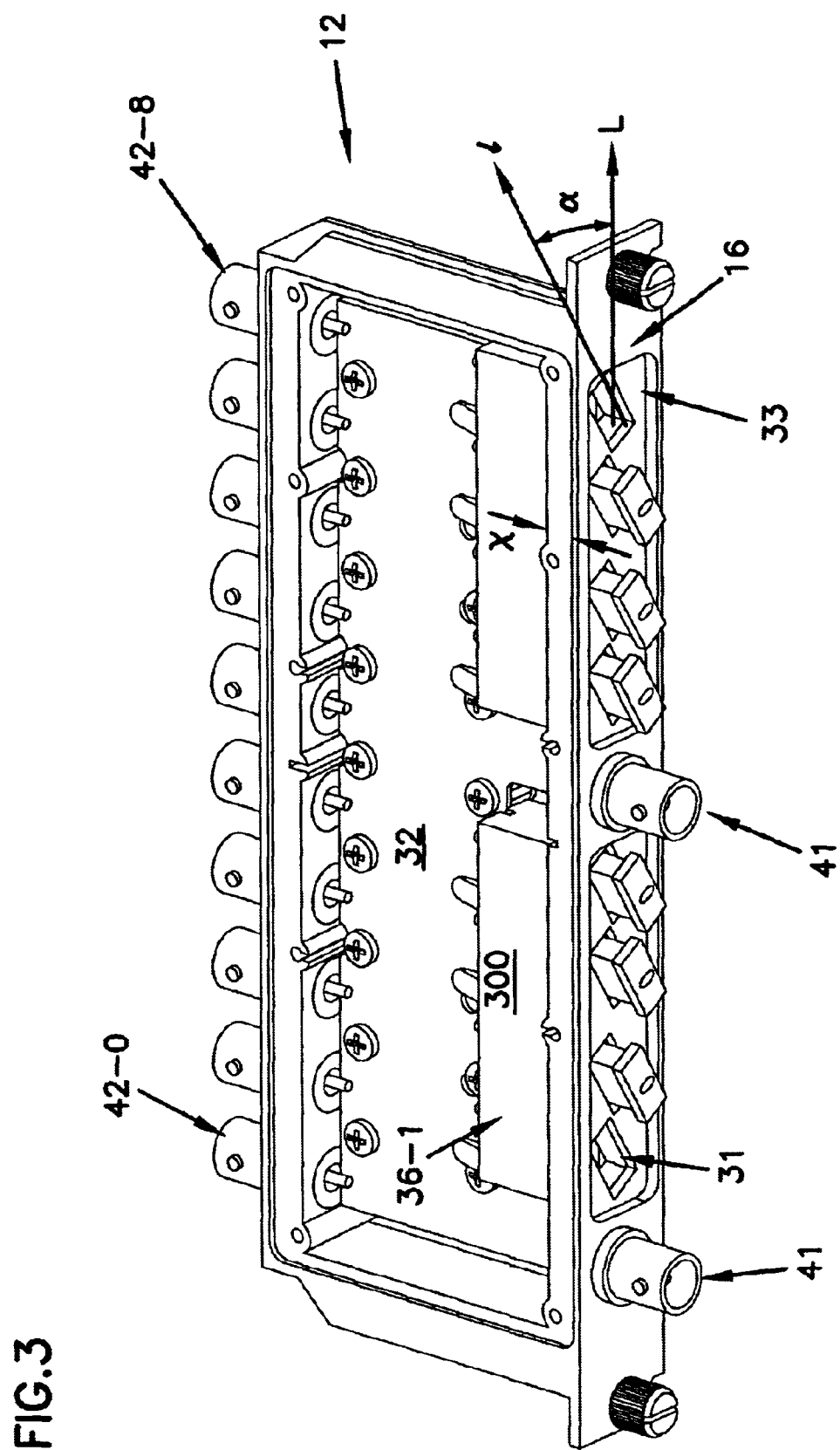
FIG. 3 is a perspective view of the eight port RF module 10 shown in FIG. 1 with the top plate removed.

With reference to FIG. 3, the module 10 further includes a plurality of connectors 42-0 to 42-8 mounted at the back 18 of the housing 12. While the connectors 42-0 to 42-8 can have any number of configurations for receiving a signal, the connectors are preferably 75 ohm coaxial connectors such as BNC type connectors or F type connectors. The connectors 42-0 to 42-8 are preferably connected to a rear edge of the circuit board 32 by conventional techniques such as card edge connectors. Additionally, grounded shields of the connectors 42-0 to 42-8 are preferably in electrical contact with the housing 12. Monitor ports 41 are electrically connected to the circuit board 32, and are adapted to be mounted at the front 16 of the housing 12.

Figure 2:
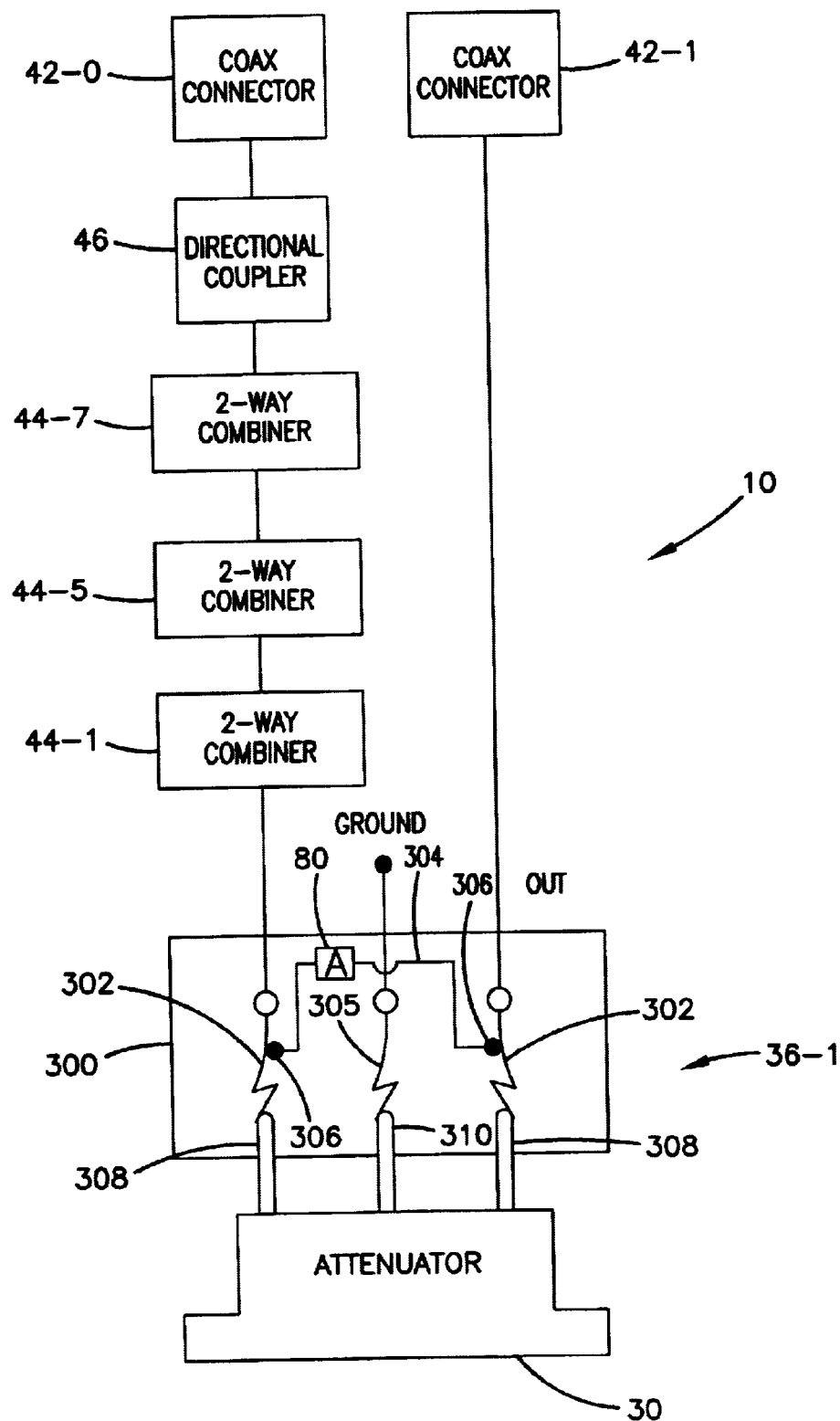
FIG. 2 schematically depicts an exemplary circuit diagram for one plug 30 the combiner of FIG. 1.

FIG. 2 schematically depicts an exemplary circuit diagram for one plug 30 of the combiner of FIG. 1. In a preferred embodiment, the plug 30 houses an attenuator circuit. As shown in FIG. 2, the combiner includes a first two-to-one combiner 44-1 preferably in the form of a transformer electrically connected to plug connector 36-1. The first combiner 44-1 and a second combiner (not shown) are electrically connected to a fifth two-to-one combiner 44-5. The fifth two-to-one combiner 44-5 and a sixth two-to-one combiner (not shown) are electrically connected to a seventh two-to-one combiner 44-7. The seventh two-to-one combiner 44-7 is electrically connected to a directional coupler 46. The directional coupler 46 is electrically connected to coaxial connector 42-0 as well as monitor port 41 as is well known to those of ordinary skill in the art.

While the configuration of FIG. 2 has been described as an eight to one coupler, it will be appreciated that the same configuration could also be used as an eight-to-one splitter with monitor capabilities by slightly modifying the configuration of the directional, coupler 46. In other words, it will be understood by those of skill in the art that the transformers 44-1 to 44-7 can be used as splitters as well as combiners.

Referring to FIG. 2, the plug connector 36-1 includes a dielectric housing 300 only a portion of which is illustrated that can be mounted at the edge of the circuit board as will be described in detail with reference to FIG. 6. Two through-contacts 302 (i.e., IN and OUT contacts) are mounted within the housing 300. One of the through-contacts 302 is electrically connected to the combiner 44-1, and the other through-contact 302 is electrically connected to the coaxial connector 42-1. A conductive bypass-path 304 is used to provide an electrical connection between the two through-contacts 302. The bypass-path 304 includes contact regions 306 positioned adjacent to each of the through-contacts 302. The base member connector 36-1 also includes a ground contact 305 positioned between the two trough-contacts 302. The ground contact 305 is electrically connected to ground.

While the through-contacts 302 and the ground contact 305 could have a variety of different configurations, the contacts 302 and 304 are depicted in FIG. 2 as resilient, conductive springs. The through-contacts 302 are preferably biased toward the contact regions 306 of the bypass-pathway 304 such that when no plug is inserted in the housing 300, the through-contacts 302 engage their respective contact regions 306 (i.e., the through-contacts "normally" engage the contact regions). The engagement between the through-contacts 302 and the contact regions 306 causes the bypass-pathway circuit 304 to be closed such that signals can be routed through the plug connector 36-1 even in the absence of a plug. Each plug 30 has three exposed terminals 308,310 that will be electrically coupled to the circuit board. It will be appreciated that contacts 302, 305, and terminals 308 and 310 may not all be located in the same plane.

As can be seen in FIG. 3, the front 16 of the housing 12 has a longitudinal axis L that extends from one of the pair of sides 20 to the other sidewall 22. The receptacles 14 in the front 16 of the housing 12 also each have a longitudinal axis l. As can be seen in FIG. 3, for example, the longitudinal axis 1 of each receptacle 14 is an angle α with respect to the longitudinal axis L of the front 16. In a preferred embodiment, the angle may range from about ±10 degrees to about ±80 degrees. In a preferred embodiment, the angle is about ±45 degrees. Because of this angle, the IN and OUT terminals of each plug 30 will straddle the circuit board 32. So the IN terminal will make contact with a first side of the circuit board and the OUT terminal will make contact with a second, opposite side of the circuit board as will be described with respect to FIG. 8. Thus, unlike a mounting which was previously described where all terminals are located on one side of the circuit board, by angling the receptacles, there is no need for using vias, for example, to bring a terminal into electrical contact with the proper layer of the circuit board. Because the IN and OUT terminals are located on opposite sides of the circuit board, isolation between ports is improved. In addition, parasitics and insertion loss are reduced and return loss of a specific port is increased.

Also, by placing the receptacles 14 at an angle, the density of plugs 30 can be increased because less space is used.

The front 16 of the housing 12 has a thickness (t) preferably ranging from about 0.2 inches to about 0.8 inches. The receptacles extend through the front 16 and create a waveguide 31 that helps reduce the signals emitted from the module. In addition, because the front 16 is thicker than known systems, the circuit board 32 located in the interior of the housing 12 is pushed further away from the front 16 of the housing 12. Due to the combination of the spacing and the thick, waveguide-shaped receptacles 14, the module 10 does not need any additional EMI shielding over the receptacles 14 and yet the module still radiates signals that are reduced to better than 100 dB down from the carrier. In modules that do use a conductive cover for shielding, when the cover is removed, signals that are only 60 dB down from the carrier are emitted which cause interference at the headend. Thus, the plugs 30 are readily accessible and can be replaced without the use of tools and the amount of signal emitting into the headend is not significantly changed. In addition, because the plugs 30 are longer in length in order to reach the plug connectors, the circuitry located inside the plastic housing of the plug is located near the exposed terminals of the plug. When the plug 30 is inserted in the plug connector, the circuitry in the plug is now located inside the module 10 instead of exterior thereto. This also provides improved performance.

The region 33 surrounding the receptacles may be recessed as shown to allow a cover to be placed over the receptacles 14. While not necessary for shielding purposes, such a cover may be desirable for aesthetic reasons. In addition, a cover may be desirable to prevent access to the plugs. Because the cover is not needed for purposes of shielding, it may be made out of a nonconductive material thereby resulting in cost savings from known systems.

FIG. 4 is a perspective view of the module shown in FIG. 1 with one of the covers 40 affixed to the front 16 of the housing 12 and the other cover 40 removed. The covers 40 may be provided with snapping barbs 15 to fasten the covers 40 to the front 16 of the housing 12. To remove a cover 40 from the front 16, opposite sides of the cover may be squeezed to disengage the snapping barbs from the recessed area in the front 16.

Figure 5:
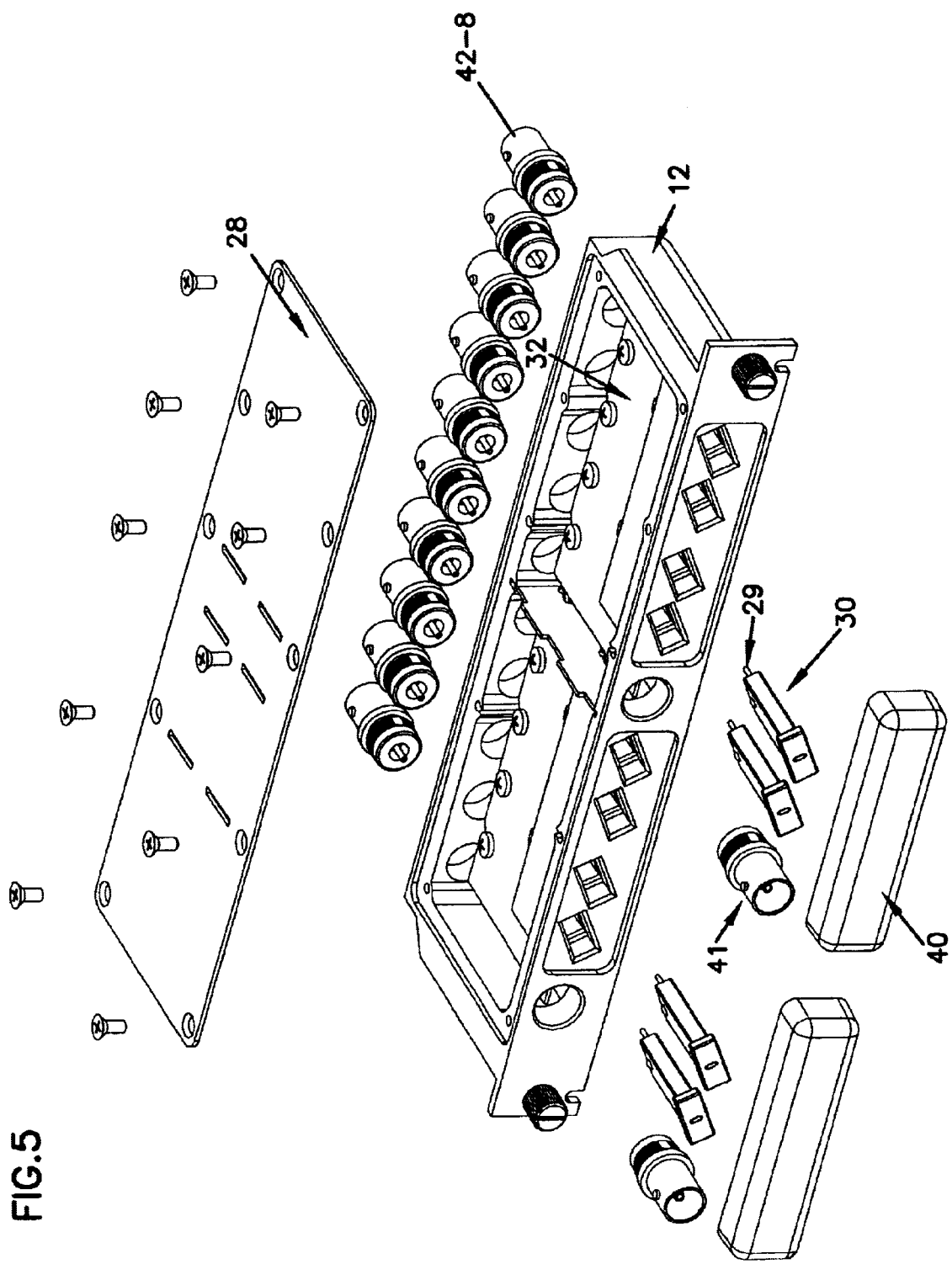
FIG. 5 is an exploded view of the module shown in FIG. 1.

FIG. 5 is an exploded view of the module shown in FIG. 1. It can be appreciated in FIG. 5 that a majority of the circuit board is pushed back away from the front 16.

Figure 6:
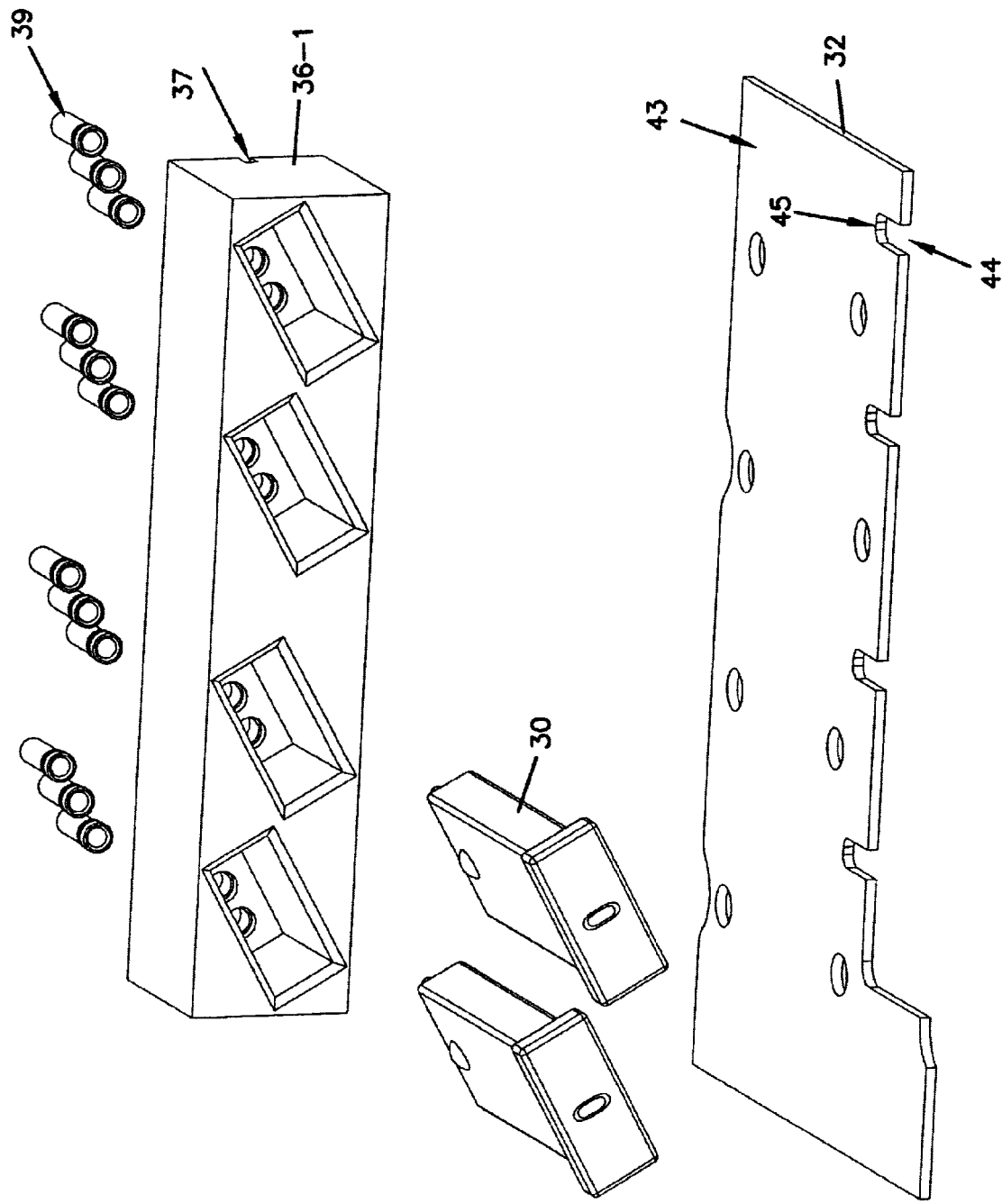
FIG. 6 is an exploded view of a portion of the circuit board, plug connector and plugs according to a preferred embodiment of the present invention.

FIG. 6 is an exploded view of a portion of the circuit board, plug connector and plugs according to a preferred embodiment of the present invention. The plug connector 36-1 has a groove 37 extending along a back wall of the plug connector 36-1. A front edge of the circuit board 32 fits into the groove. Each plug 30 has three exposed terminals in a rear portion of the plug. Partially located in the plug connector 36-1 are three sockets 39, one for each of the plugs terminals. The sockets 39 are only partially inserted in the plug connector, the remaining portion is exposed so that it may make electrical contact with appropriate layers on the circuit board 32 as will be described in detail hereinafter. The circuit board 32 has a plurality of layers. On a first side 43 the board will have conductive traces and circuitry such as transformers (none of which are illustrated). Likewise, a second side opposite the first side 43 also will have conductive traces and circuitry. Located along the front edge of the circuit board are a plurality of recesses 44. Recesses 44 expose a conductive trace 45 located in the center of the board. This conductive trace 45 is held at ground. When the sockets 39, plug connectors 36-1,2 and circuit board 32 are assembled, the middle socket is located in a recess 44 and the exposed portion of the socket is soldered to trace 45. The other two terminals adjacent the middle one extend through their respective sockets and one terminal will lie on a top surface of the circuit board and the other terminal will lie on a bottom surface of the circuit board.

Figure 8:
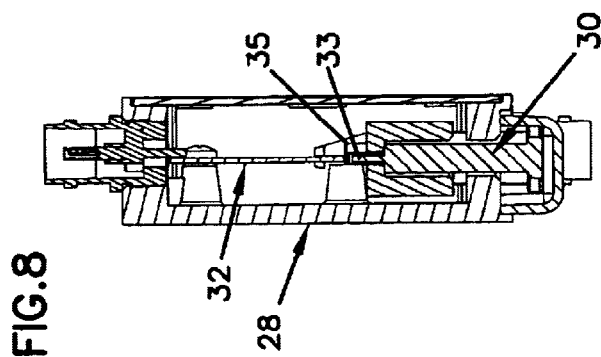
FIG. 8 is a cross-sectional view of the module shown in FIG. 7 taken along lines 8—8.
Figure 7:
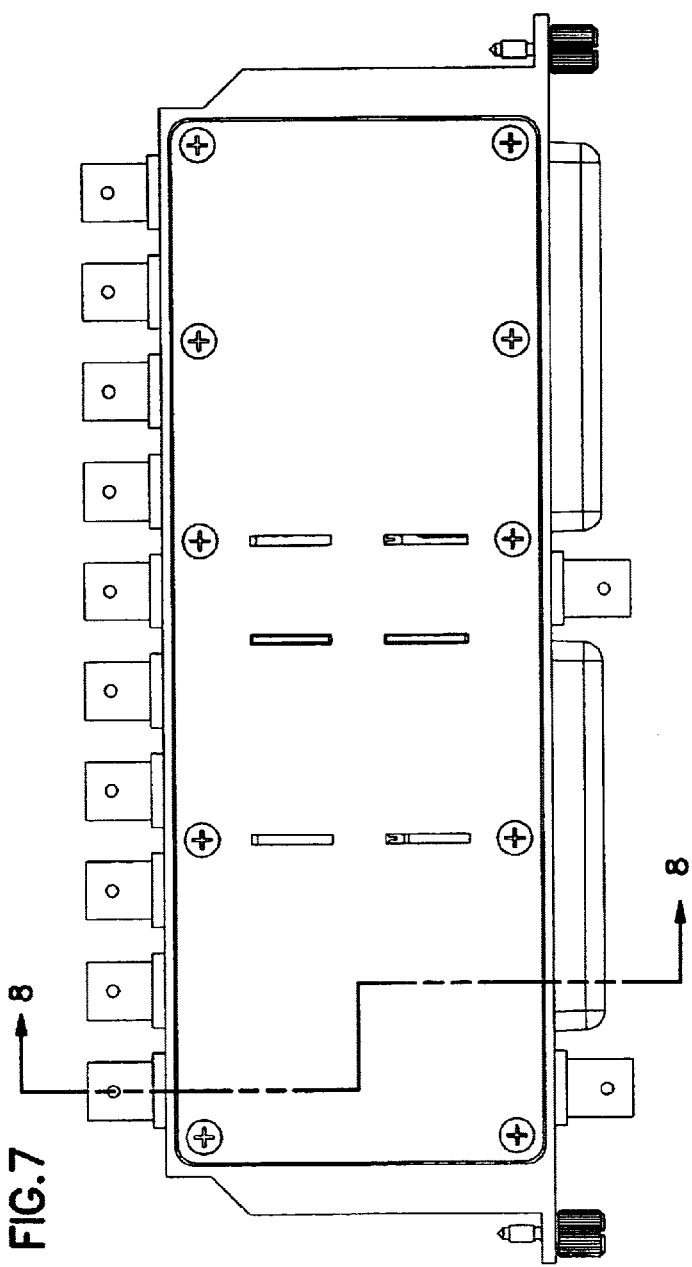
FIG. 7 is a top view of the module shown in FIG. 1.
Figure 9:
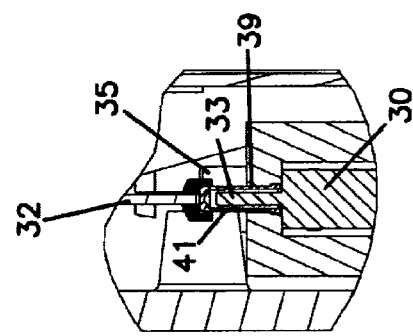
FIG. 9 is an enlarged view of a portion of the cross-section shown in FIG. 8.

FIG. 7 is a top view of the module shown in FIG. 1. FIG. 8 is a cross-sectional view of the module shown in FIG. 7 taken along lines 8—8. In the cross section, all of the parts are assembled. FIG. 9 is an enlarged view of a portion of the cross-section shown in FIG. 8 showing the arrangement of the plug connector 36- 1, plug 30 and circuit board 32. The middle terminal 33 slides inside the middle socket which is electrically coupled to the ground trace located in the center of the circuit board. One of the other two terminals 35 is shown contacting the bottom surface of the circuit board and the other terminal is not shown but contacts the top surface of the circuit board.

FIG. 10 is a side view of a module 100 according to another preferred embodiment of the present invention. Some internal structures of the module 100 are shown in dashed lines. Not all of the internal structures of the module 100 have been illustrated. In addition, no external structure such as mounting flanges or connectors has been illustrated for purposes of clarity. In this preferred embodiment, a housing 112 preferably made of conductive material houses a circuit board 132. In this preferred embodiment the circuit board has been rotated 90 degrees from the preferred embodiments already discussed. Located in the front 116 of the housing 112 are a plurality of receptacles 114 sized to receive plugs 130. The receptacles 114 are formed in the housing which is made of conductive material and thus the receptacles form waveguides that attenuate emissions. FIG. 11 is a front view of the module 100 shown in FIG. 10.

FIG. 12 is a cross-sectional view of a portion of a receptacle according to a preferred embodiment of the present invention. Instead of making the front of the housing thicker to create the waveguide, the plug connector itself may be provided with its own individual waveguide. As seen in FIG. 12, the plug connector forms a receptacle to receive a plug and has a front portion 200 and a rear portion 202. The front portion 200 is made of conductive material whereas the rear portion 202 is made of nonconductive material. The front portion 200 of the plug connector thus form the waveguide.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A module for containing a circuit, the module comprising:
    a housing having a front, the front having a longitudinal axis;
    a receptacle accessible from the front of the housing, the receptacle being shaped to receive a circuit component, the receptacle having its own longitudinal axis wherein the longitudinal axis of the receptacle is at an angle less than ±90 degrees with reference to the longitudinal axis of the front of the housing, and the circuit component being a removable plug;
    a circuit board located in the interior of the housing, wherein the circuit board has a first conductive pathway on a first surface of the circuit board and a second conductive pathway on a second surface of the circuit board opposite the first surface; and
    a plug connector mounted on the circuit board for receiving the plug, wherein the plug has a first terminal and a second terminal extending from a back portion of the plug so that the first and second terminals are exposed in the back portion, and wherein the plug fits in the receptacle and is received in the plug connector and the first terminal is electrically coupled to the first conductive pathway on the first surface of the circuit board and the second terminal is electrically coupled to the second conductive pathway on the second surface of the circuit board.

2. A module according to claim 1 further comprising a plurality of receptacles accessible from the front of the housing wherein each receptacle is shaped to receive an individual circuit component, each receptacle has its own longitudinal axis wherein the longitudinal axis of each receptacle is at an angle with reference to the longitudinal axis of the front of the housing.

3. A module according to claim 1 wherein the receptacle has the shape of a rectangular chamber.

4. A module according to claim 1 wherein the front of the housing is recessed in a region surrounding the receptacle.

5. A module according to claim 4 further comprising a cover shaped to fit within the recess wherein the cover extends over the receptacle.

6. A module according to claim 5 further comprising a means for attaching the cover to the front of the housing.

7. A module according to claim 5 further comprising a snapping barb for securing the cover to the front of the housing.

8. A module according to claim 1 wherein the plug includes a third terminal located between the first and second terminals wherein the third terminal extends into the circuit board.

9. A module according to claim 8 wherein the circuit board is a layered circuit board and has a ground plane located in a center layer, wherein the third terminal of the plug contacts the ground plane layer of the circuit board.

10. A module according to claim 1 wherein the longitudinal axis of the receptacle is at an angle with respect to the longitudinal axis of the housing that ranges from about ±10 to about ±80.

11. A module according to claim 10 wherein the angle is about ±45 degrees.

12. A module according to claim 1 wherein the plug has a plastic housing and circuitry located in the plastic housing near the back portion of the plug so that when the plug is inserted in the receptacle and received by the plug connector, the circuitry is located in the interior of the housing.

13. A module according to claim 1 wherein the housing is made of a conductive material.

14. A module according to claim 5 wherein the cover is made of a nonconductive material.

15. A module according to claim 5 wherein the cover when placed in the recessed opening of the front obstructs access to the receptacle.

16. A module according to claim 12 wherein the circuitry includes an attenuator circuit.

17. A module according to claim 1 further comprising:
    a plurality of coax connectors secured to a back of the housing; and
    a plurality of connection locations on the circuit board wherein the coax connectors are coupled to the connection locations.

18. A module according to claim 17 wherein the circuit board includes a plurality of circuit components interconnected with one another and with the connection locations through a plurality of circuit paths wherein the plurality of circuit components includes splitter components for receiving a main signal from one of the connection locations and dividing the main signal into a plurality of branch signals delivered along the circuit paths to individual reaming ones of the connection locations.

19. A module according to claim 17 wherein the circuit board includes a plurality of circuit components interconnected with one another and with the connection locations through a plurality of circuit paths wherein the plurality of circuit components includes combiner components for receiving a plurality of branch signals from individual ones of the connection locations and combing the branch signals into a main signal delivered along the circuit paths to a remaining one of the connection locations.

* * * * *